United States Patent
Ando et al.

(10) Patent No.: US 10,147,903 B2
(45) Date of Patent: *Dec. 4, 2018

(54) DISPLAY DEVICE WITH OVERLAPPING SUBSTRATE

(71) Applicant: Japan Display Inc., Tokyo (JP)

(72) Inventors: Naohisa Ando, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/808,250

(22) Filed: Nov. 9, 2017

(65) Prior Publication Data

US 2018/0069192 A1     Mar. 8, 2018

Related U.S. Application Data

(63) Continuation of application No. 15/187,249, filed on Jun. 20, 2016, now Pat. No. 9,843,018.

(30) Foreign Application Priority Data

Jun. 26, 2015   (JP) .................................. 2005-128319

(51) Int. Cl.
   *H01L 29/18*     (2006.01)
   *H01L 51/52*     (2006.01)
   (Continued)

(52) U.S. Cl.
   CPC ...... *H01L 51/5246* (2013.01); *H01L 51/0097* (2013.01); *H01L 27/322* (2013.01);
   (Continued)

(58) Field of Classification Search
   None
   See application file for complete search history.

(56) References Cited

U.S. PATENT DOCUMENTS 9,843,018 B2 * 12/2017 Ando ................. H01L 51/5246
2002/0180923 A1   12/2002 Aoyagi et al.
(Continued)

FOREIGN PATENT DOCUMENTS

JP    2009-246820 A    10/2009
JP    2013-015835 A    1/2013
(Continued)

OTHER PUBLICATIONS

South Korean Office Action dated Jan. 22, 2018 for corresponding Korean application No. 10-2016-0070240. With Partial English Translation.
Taiwanese Office Action dated Jan. 23, 2017 for corresponding Taiwanese Application No. 105112162 with partial translation.

*Primary Examiner* — Cory W Eskridge
(74) *Attorney, Agent, or Firm* — TYPHA IP LLC (57) ABSTRACT

A display device includes a substrate including a peripheral region folded back to face a rear surface of the substrate, and a counter region facing the peripheral region; and a filling member held between the peripheral region and the counter region. The substrate is folded such that the display device includes a first overlapping portion where a part of the peripheral region is bonded with the counter region with an adhesive material being provided therebetween; a second overlapping portion where a part of the peripheral region is in direct contact with the filling member; and a third overlapping portion where a part of the peripheral region is bonded with the filling member with an adhesive material being provided therebetween.

15 Claims, 8 Drawing Sheets

(51) Int. Cl.
*H01L 51/00* (2006.01)
*H01L 27/32* (2006.01)

(52) U.S. Cl.
CPC ...... *H01L 27/3244* (2013.01); *H01L 51/5253* (2013.01); *H01L 51/5284* (2013.01); *H01L 2251/5338* (2013.01); *Y02E 10/549* (2013.01)

(56) References Cited

U.S. PATENT DOCUMENTS

| | | |
|---|---|---|
| 2007/0246248 A1 | 10/2007 | Ueda et al. |
| 2009/0244834 A1 | 10/2009 | Sugimori et al. |
| 2012/0249927 A1 | 10/2012 | Nakagawa et al. |
| 2012/0314383 A1 | 12/2012 | Oohira |
| 2013/0279088 A1 | 10/2013 | Raff et al. |
| 2014/0247405 A1 | 9/2014 | Jin et al. |
| 2014/0307378 A1 | 10/2014 | Kang |
| 2014/0307396 A1 | 10/2014 | Lee |
| 2016/0035759 A1* | 2/2016 | Kwon ................ H01L 27/1244 257/40 |

FOREIGN PATENT DOCUMENTS

| | | |
|---|---|---|
| KR | 10-2014-0108827 A | 9/2014 |
| KR | 10-2014-0122597 A | 10/2014 |
| KR | 10-2014-0122875 A | 10/2014 |
| TW | 201237720 A | 9/2012 |
| TW | 201248268 A | 12/2012 |
| TW | 201303434 A | 1/2013 |

* cited by examiner

DISPLAY DEVICE WITH OVERLAPPING SUBSTRATE

CROSS REFERENCE TO RELATED APPLICATIONS

This application is a continuation of U.S. patent application Ser. No. 15/187,249 filed on Jun. 20, 2016. Further, this application claims the benefit of priority from the prior Japanese Patent Application No. 2015-128319 filed on Jun. 26, 2015, the entire contents of which are incorporated herein by reference.

FIELD

The present invention relates to a display device, and specifically, to a substrate structure of a flexible display device.

BACKGROUND

An organic electroluminescence (hereinafter, referred to as "organic EL") display device includes a light emitting element provided in each of a plurality of pixels and displays an image by controlling light emission of each of the light emitting elements independently. The light emitting element has a structure in which a layer containing an organic EL material (hereinafter, also referred to as a "light emitting layer") is interposed between a pair of electrodes, one of which is an anode electrode and the other of which is a cathode electrode. In such an organic EL display device, one of the electrodes is provided in each pixel as a pixel electrode, and the other electrode is provided in correspondence with the plurality of pixels as a common pixel electrode supplied with a common potential. The organic EL display device applies a potential of the pixel electrode in each pixel with respect to the potential of the common electrode, so as to control the light emission of each pixel.

Organic EL display devices, especially, flexible display devices including a thin substrate formed of a resin such as polyimide (PI) or the like have been actively developed. Such a flexible display device is produced as follows. A substrate including a support plate formed of glass or the like, a resin film formed of PI or the like provided thereon, and a thin film transistor circuit element and a light emitting element sequentially provided on the resin film is prepared (such a substrate is referred to as a "TFT-side substrate"). In the meantime, a substrate including another support plate, a resin film formed of PI or the like provided thereon, and color filters (CF) provided on the resin film is prepared (such a substrate is referred to as a "CF-side substrate"). These substrates are assembled together, and the two support plates are removed. The resultant assembly is divided into individual display devices. In this manner, flexible display devices including the thin PI resin substrates are produced.

Regarding such a flexible display device, the area size of a frame region outside a display area is desired to be decreased. In the vicinity of one side of the TFT-side substrate, namely, along one end of the TFT-side substrate, a plurality of terminals are provided. In order to decrease the area size of the frame region, it is conceivable to bend the end. It is conceivable to, for example, bend, by about 180 degrees, the end of the PI resin substrate along which the terminals are provided, so that the terminals are located on a rear surface of a panel.

For example, Japanese Laid-Open Patent Publication No. 2009-246820 discloses a display panel having a bent end portion. This publication discloses a mobile phone terminal solving the problems that, for example, with mere light-blocking printing, the entire surface except for the light irradiation area is not shielded against light and light leak occurs. The terminal includes a flat housing portion and a curved panel located on the flat housing portion. The curved panel includes a flat plate portion and a curved plate portion. A rear surface of the flat plate portion of the curved panel is provided with light-blocking printing. The flat housing portion and the flat plate portion of the curved panel are bonded together, with a light-blocking sheet member having a high light-blocking property being provided therebetween. With such a structure, colorful illumination is displayed on a rear panel of the mobile phone terminal. Unlike the present invention, the mobile phone terminal disclosed in this publication does not intend to increase the ratio of the display area size with respect to the sheet area size by bending the end of the panel, and the end portion is bent merely at about 90 degrees.

Japanese Laid-Open Patent Publication No. 2013-015835 discloses a flexible display panel including a flexible substrate that includes a first region, a second region extending from the first region and having a curved surface, and a third region bent with respect to the second region; a first display area located in the first region; a second display area located in the second region; non-display areas located outer to the first display area or the second display area, at least one of the non-display areas being located in the third region; and a sealing member sealing the first display area and the second display area. Unlike the present invention, the flexible display panel disclosed in this publication does not intend to increase the ratio of the display area size with respect to the sheet area size by bending the end of the panel, and the end portion is bent merely at about 90 degrees.

SUMMARY

An embodiment according to the present invention is directed to a display device including a substrate having a front surface at which display is provided and a rear surface opposite to the front surface, the substrate including a peripheral region located along a first side of the substrate and folded back to face the rear surface, and a counter region facing the peripheral region; and a filling member held between the peripheral region and the counter region. The substrate is folded such that the display device includes a first overlapping portion where a part of the peripheral region is bonded with the counter region with an adhesive material being provided therebetween; a second overlapping portion where a part of the peripheral region is in direct contact with the filling member; and a third overlapping portion where a part of the peripheral region is bonded with the filling member with an adhesive material being provided therebetween.

In an embodiment, the first overlapping portion, the second overlapping portion and the third overlapping portion are located in this order from the first side; and the filling member is made gradually thinner from the second overlapping portion toward the first overlapping portion.

DESCRIPTION OF EMBODIMENTS

Hereinafter, embodiments of the present invention will be described with reference to the drawings and the like. The present invention may be carried out in various many embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted.

In this specification, an expression that a component or area is "on" another component or area encompasses a case where such a component or area is in contact with the another component or area and also a case where such a component or area is above or below the another component or area, namely, a case where still another component or area is provided between such a component or area and the another component or area, unless otherwise specified.

It is now assumed that an end portion of a PI resin substrate along which terminals are provided is folded, and a rear surface of the PI resin substrate and the folded end portion are made close to each other and bonded together with a pressure-sensitive adhesive member or an adhesive member such as, for example, a two-sided tape or the like. In this case, in a part in the vicinity of an inner surface of the curved portion of the PI resin substrate, the rear surface and the folded end portion are not made close to each other sufficiently, and as a result, the distance therebetween the rear surface and the folded end portion is larger than the thickness of the pressure-sensitive adhesive member or the adhesive member. Therefore, a gap (space) where the rear surface and the folded end portion are not in contact with each other is formed in a part inner to the curved portion of the PI resin substrate. In the case where a force is applied in a direction of compressing the gap, lines in the folded end portion may undesirably be broken. The present invention made in light of this problem has an object of providing a flexible display device in which a gap is not easily formed inner to the folded end portion and thus the lines are prevented to be broken.

Figure 1A:
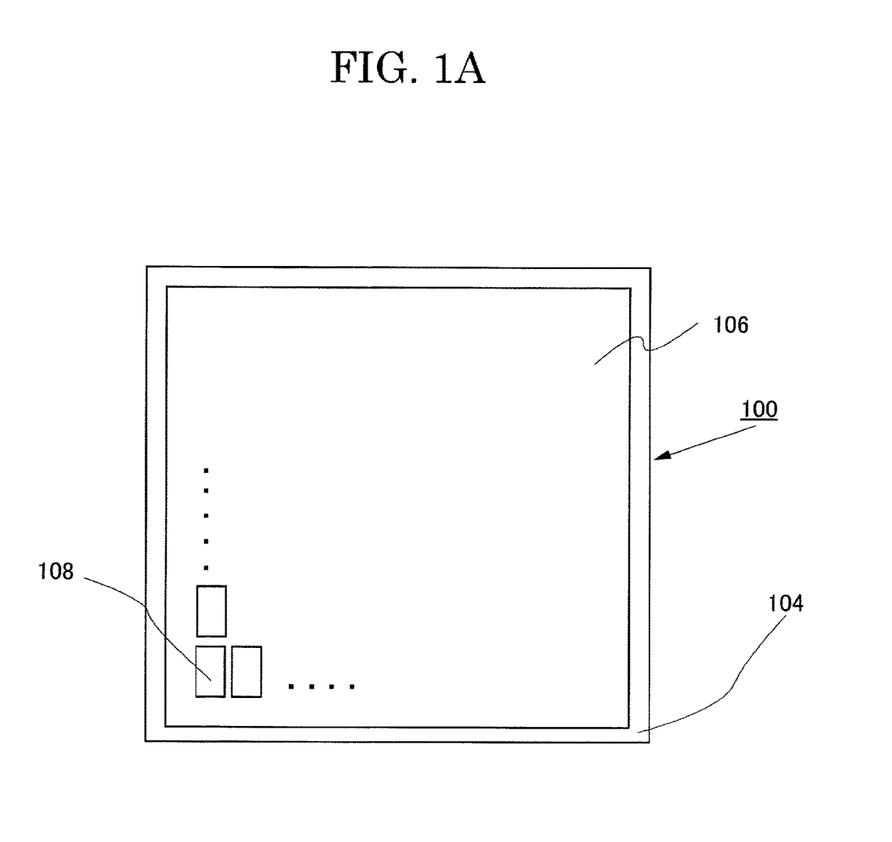
FIG. 1A is a schematic plan view of a display device in an embodiment according to the present invention.
Figure 1B:
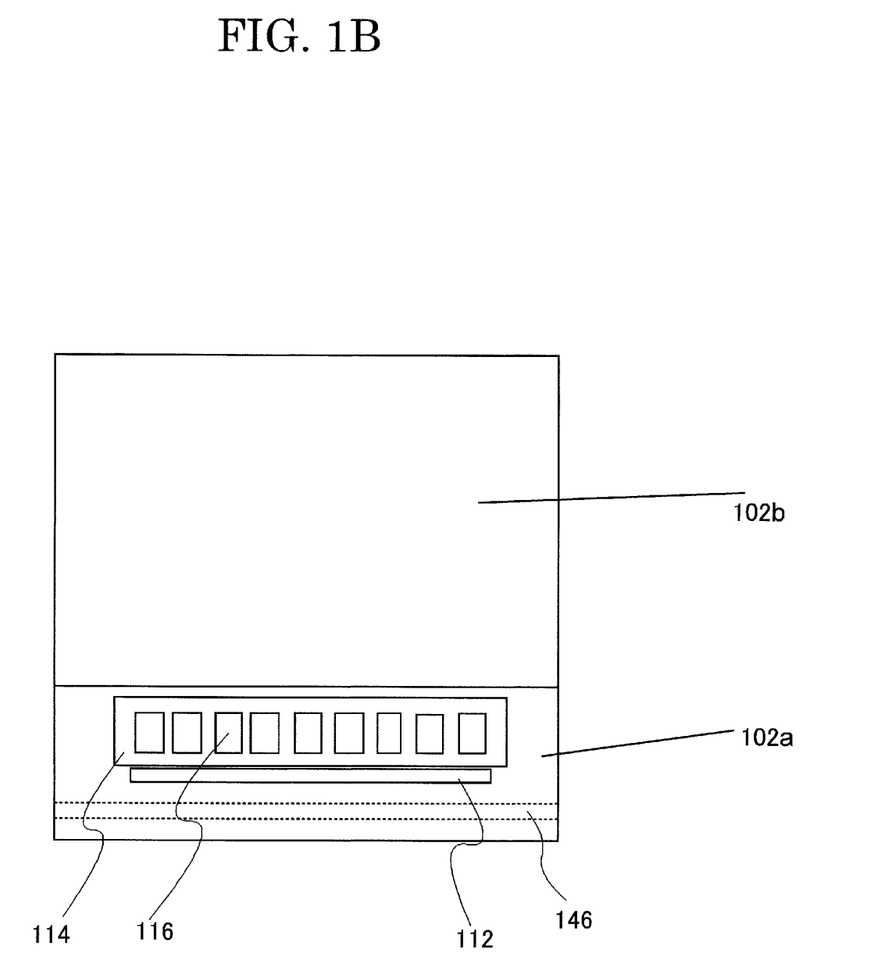
FIG. 1B is a schematic rear view of the display device in the embodiment according to the present invention.

A structure of a display device 100 in an embodiment according to the present invention will be described with reference to FIG. 1A, FIG. 1B, FIG. 2 and FIG. 3. FIG. 1A is a schematic plan view of the display device 100 in this embodiment. FIG. 1B is a schematic rear view of the display device 100 in this embodiment.

The display device 100 includes a first substrate 102 having a display region 106 provided thereon. The display region 106 includes an array of a plurality of pixels 108. On a top surface of the display region 106, a second substrate 104 is provided so as to face the first substrate 102. The second substrate 104 may be secured to the first substrate 102 by a sealing member enclosing the display region 106. A space between the first substrate 102 and the second substrate 104, and a space inside the sealing member, may be filled with a filler. Such a structure seals a light emitting layer such that light emitting elements provided in the pixels 108 are not exposed to the air. Thus, the light emitting elements are suppressed from being deteriorated.

A terminal region 114 is provided on a rear surface of the display device 100. The first substrate 102 has a front surface, at which display is provided, and a rear surface opposite to the front surface. The terminal region 114 is provided along an end (or one side among sides) of the front surface. As shown in FIG. 1B, the first substrate 102 is folded, so that a folded portion 102a (folded-back portion) including the terminal region 114 faces a part of a rear surface 102b of the first substrate 102 (such a part of the rear surface 102b will be referred to as a "counter region"). The terminal region 114 includes a plurality of connection terminals 116. In each of the connection terminals 116, a wiring board (e.g., flexible printed circuit board) connecting a device that outputs a video signal, a power supply and the like with a display panel is provided. A contact of the connection terminal 116 with the wiring board is exposed outside. A driver circuit 112 (e.g., driver IC) may be provided in the terminal region 114.

Figure 2:
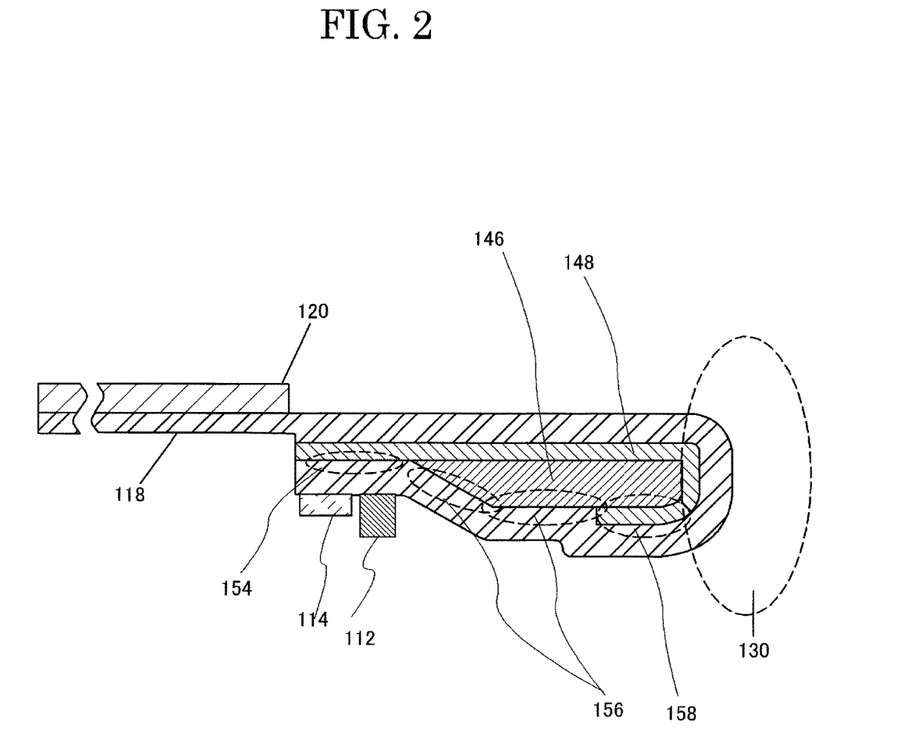
FIG. 2 is a schematic view showing a structure of a display device in an embodiment according to the present invention.
Figure 3:
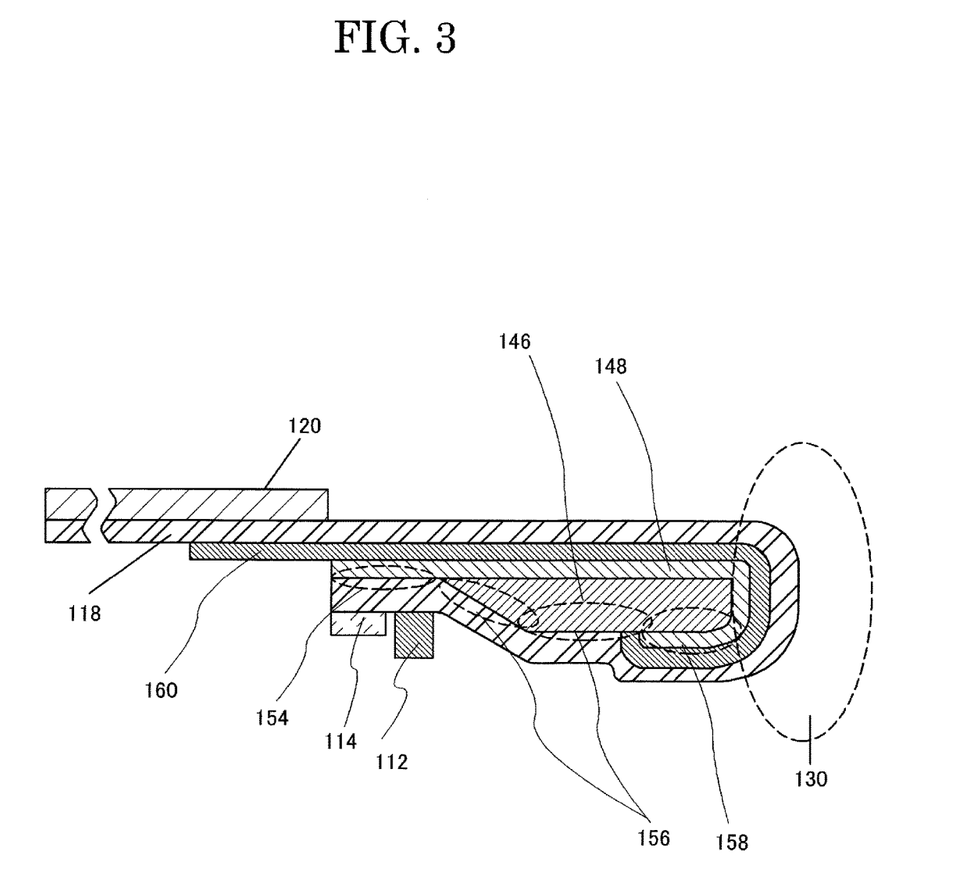
FIG. 3 is a schematic view showing a structure of a display device in an embodiment according to the present invention.

The display device 100 in this embodiment includes a TFT-side substrate 118 including thin film transistor circuit elements, light emitting elements and the connection terminals 116, and a CF-side substrate 120 including color filters (CFs). As shown in FIG. 2 and FIG. 3, the TFT-side substrate 118 and the CF-side substrate 120 are assembled together.

First, the TFT-side substrate 118 will be described. The TFT-side substrate 118 includes the first substrate 102 formed of, for example, polyimide, and also includes a TFT layer, the light emitting layer, a sealing layer and the like provided on the first substrate 102 (As described in FIG. 1B).

The first substrate 102 includes a first region and a second region. The plurality of pixels 108 are located on the first region, and the connection terminals 116 are located on the second region. Namely, the first region corresponds to the display region 106 displaying an image. By contrast, the second region corresponds to the terminal region 114. The second region may be expressed as a region of the first substrate 102 excluding the first region. According to the present invention, the second region of the first substrate 102 is located on the rear surface of the display device 100.

In the following description, the first region will be also referred to as the "display region", and the second region will be also referred to as a "peripheral region". According to the present invention, the second region is folded along one side of the display device 100 and is folded back to be located on the rear surface of the display device 100. FIG. 1A is a schematic plan view of the display device 100 in an embodiment according to the present invention, and the peripheral region is shown in FIG. 1B, which is a rear view of the display device 100.

The light emitting elements are located in the display region 106 displaying an image. The light emitting elements each have a structure in which a pixel electrode located in each pixel 108 and a common electrode provided in correspondence with the plurality of the pixels 108 hold the light emitting layer therebetween.

In the case where the light emitting element includes a light emitting layer formed of an organic EL material, the organic EL material may be a low molecular weight type organic material or a high molecular weight type organic material. In the case where a low molecular weight type organic material is used, the light emitting element includes the light emitting layer formed of such a light emitting organic material, and also includes a hole injection layer and an electron injection layer, and further a hole transfer layer and an electron transfer layer, provided to sandwich the light emitting layer. In this embodiment, the light emitting layer emits white light, and full-color light emission is realized by the color filters.

The sealing layer is located on the light emitting elements and compensates for the ruggedness caused by the light emitting elements to provide a flat surface. The sealing layer is preferably an insulating layer that blocks entrance of moisture to the light emitting elements. Such an insulating layer may be an inorganic insulating layer or an organic insulating layer. Alternatively, the sealing layer may have a stack structure including an inorganic insulating layer and an organic insulating layer.

Now, the CF-side substrate 120 will be described. The CF-side substrate 120 includes the second substrate 104 formed of, for example, polyimide, and also includes a color filter (CF) layer, a sealing member, and a filler provided on the second substrate 104.

The CF layer is located on a region of the second substrate 104 that corresponds to the display region 106. The CF layer includes R (red), G (green) and B (blue) color filters located side by side and a light-blocking layer demarcating the color filters of the three colors (such a light-blocking layer is also referred to as a "black matrix"). The light-blocking layer is provided to prevent light leak between the pixels and thus to prevent a display fault such as color mixing or the like.

The sealing member is located to enclose the region corresponding to the display region 106. The filler is located to fill the region enclosed by the sealing member.

The sealing member bonds the first substrate 102 and the second substrate 104 to each other. The light emitting elements provided in the display region 106 are sealed by the sealing member and the filler so as not to be exposed to the air. Such a sealing structure suppresses the light emitting elements from being deteriorated. The filler may be formed of, for example, a material containing an epoxy resin, which is transparent.

<Embodiment 1>

In the display device 100 according to the present invention, the peripheral region of the substrate (terminal region 114) is folded back to the rear surface, so that the area size ratio of the display region 106 with respect to the area size of the display device 100 is increased. As shown in FIG. 2, a filling member 146 is located to be held between the folded-back portion 102a of the first substrate 102 and a part (counter region) of the rear surface of the first substrate 102.

In this embodiment, as shown in FIG. 2, the display device 100 includes a first overlapping portion 154 in which a part of the peripheral region is bonded with the rear surface of the TFT-side substrate 118 (or the first substrate 102) with an adhesive material 148 (e.g., a pressure-sensitive adhesive layer) being provided therebetween, a second overlapping portion 156 in which a part of the peripheral region is in direct contact with the filling member 146, and a third overlapping portion in which a part of the peripheral portion is bonded with the filling member 146 with the adhesive material 148 being provided therebetween. With this structure, a gap (space) is not easily formed in the part inner to a curved portion 130 of the folded-back portion 102a. In other words, the part which is in the vicinity of an inner surface of the curved portion 130 and in which the folded-back portion 102a of the first substrate 102 and the rear surface of the first substrate 102 are not in contact with each other is filled with the filling member 146. Since the gap is not easily formed, even if a pressure is applied to the curved portion 130, lines located in the TFT-side substrate 118 are prevented from being broken.

In FIG. 1B, the filling member 146 is represented by dotted lines. The filling member 146 may be located continuously or intermittently in the area, along the side, represented by the dotted lines.

Figure 7:
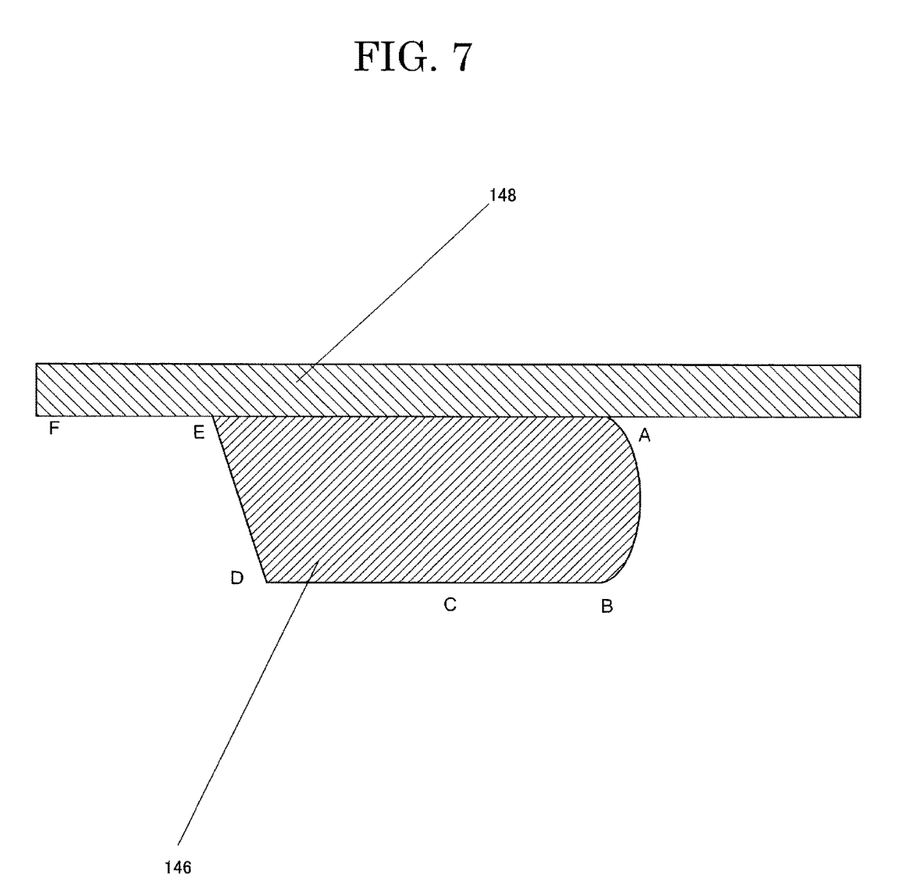
FIG. 7 is a schematic view of a filling member.

FIG. 7 is a schematic view of the filling member 146. A portion of the filling member 146 between point A and point B is preferably curved in order to decrease the size of the gap or to fill the gap with the filling member 146. A portion of the filling member 146 between point A and point C corresponds to the third overlapping portion 158, in which in the state where the TFT-side substrate 118 is folded back, the folded-back portion of the TFT-side substrate 118 and the filling member 146 are bonded with each other with the adhesive material 148 being provided therebetween. A portion of the filling member 146 between point C and point E corresponds to the second overlapping portion 156, in which the filling member 146 and the TFT-side substrate 118 are in direct contact with each other without the adhesive material 148. A portion of the filling member 146 between point E and point F corresponds to the first overlapping portion 154, in which the adhesive material 148 is bonded with the TFT-side substrate 118 without the filling member 146.

A portion of the filling member 146 between point D and point E does not need to be curved. In this portion, the filling member 146 and the TFT-side substrate 118 are in contact with each other without the adhesive material 148. Therefore, this portion is preferably inclined (tapered) with a straight outer contour, so that the filling member 146 and the TFT-side substrate 118 are in closer contact with each other. A portion of the TFT-side substrate 118 that faces the portion of the filling member 146 between point A and point B is curved. Therefore, as described above, this portion of the TFT-side substrate 118 (or the first substrate 102) is referred to as the "curved portion 130", which is represented by the dashed line in FIG. 2. In the curved portion 130, neither the terminal region 114 nor the driving circuit 112 is located. The terminal region 114 and the driving circuit 112 are located in a non-curved portion of the TFT-side substrate 118 (or the first substrate 102) between the curved portion 130 and the end of the TFT-side substrate 118.

The first overlapping portion 154, the second overlapping portion 156 and the third overlapping portion 158 are located in this order from the side of the display region 106. The portion of the filling member 146 between point D and point E is tapered as described above, such that the filling member 146 is made gradually thinner from the second overlapping portion toward the first overlapping portion. The shape of the filling member 146 may be changed, so that the shape of the overlapping portions is changed.

<Production Method in Embodiment 1>

Figure 4:
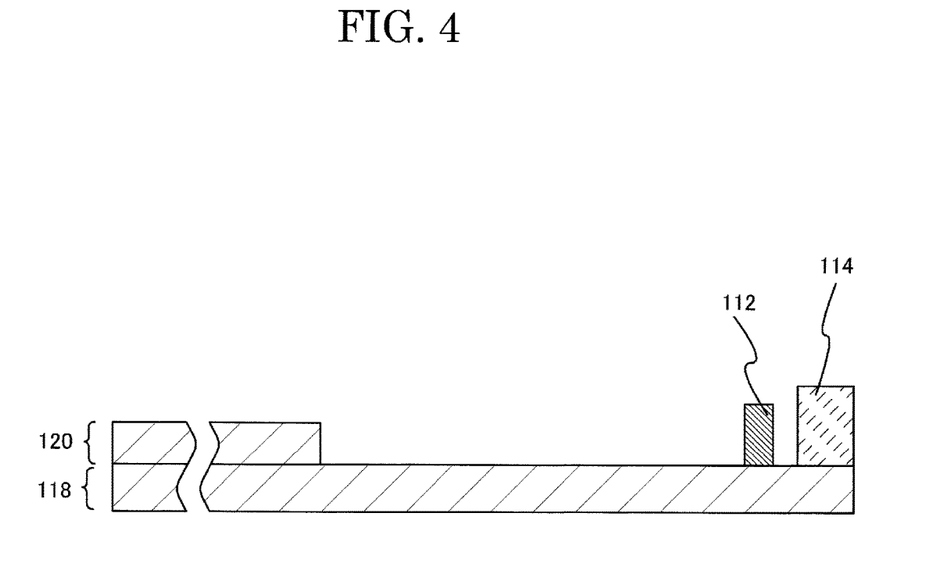
FIG. 4 is a cross-sectional view showing a method for producing the display device in the embodiment according to the present invention.
Figure 5:
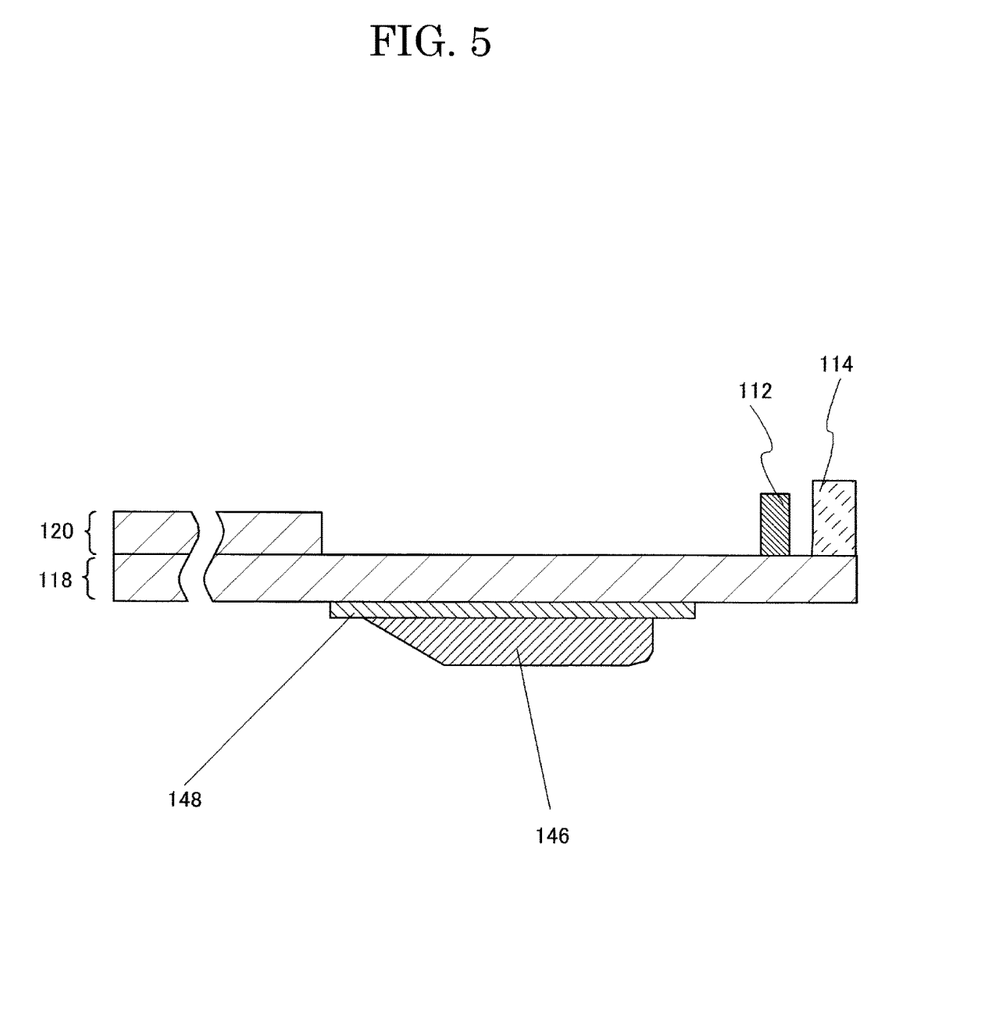
FIG. 5 is a cross-sectional view showing a method for producing the display device in the embodiment according to the present invention.

From the state shown in FIG. 4, the adhesive material 148 and the filling member 146 are formed to provide the state shown in FIG. 5. The adhesive material 148 may be formed of a commonly used pressure-sensitive adhesive such as an acrylic pressure-sensitive adhesive or the like, or a pressure-sensitive adhesive tape. As shown in FIG. 5, the adhesive material 148 and the filling member 146 are formed on the rear surface of the TFT-side substrate 118, inner to the terminal region 114 and the driving circuit 112 (closer to the display region 106 in FIG. 1A). The adhesive material 148 and the filling member 146 are formed along a side, among sides of the TFT-side substrate 118, along which the terminal region 114 is provided. The adhesive material 148 and the filling member 146 may be formed along the entirety of, or a part of, the side. In consideration of the mass-productivity, an end of the adhesive material 148 overlaps an end of the CF-side substrate 120 (or the second substrate 104) as seen in a plan view, in order to decrease the variance in the position at which the adhesive material 148 is located. Alternatively, it is desirable that the end of the adhesive material 148 is in the vicinity of the end of the CF-side substrate 120 (or the second substrate 104). The filling member 146 may be formed of a commonly used resin such as an epoxy resin, a polyamide resin, a polyimide resin or the like.

From the state shown in FIG. 5, the TFT-side substrate 118 is folded back to provide the state shown in FIG. 2. For providing the state shown in FIG. 2, in order to prevent a gap from being formed in the part inner to the folded-back portion, it is desirable to put into contact, or bond, the TFT-side substrate 118, the adhesive material 148 and the filling member 146 with each other at the points A through F in the order of points A, B, C, D, E and F shown in FIG. 7. In this manner, no gap is formed in the part inner to the folded-back portion, and thus the lines located in the TFT-side substrate 118 are prevented from being broken.

<Embodiment 2>

In embodiment 2, as shown in FIG. 3, a protective film 160 is provided on a surface of the first substrate 102 (TFT-side substrate 118) that is opposite to the CF-side substrate 120, namely, on the rear surface of the first substrate 102. The protective film 160 is provided to, for example, physically protect the panel, improve the strength of the panel in the state where the panel is folded, and prevent entrance of moisture to the inside of the panel via the first substrate 102 and protect the lines, the light emitting layer and the like.

Figure 6:
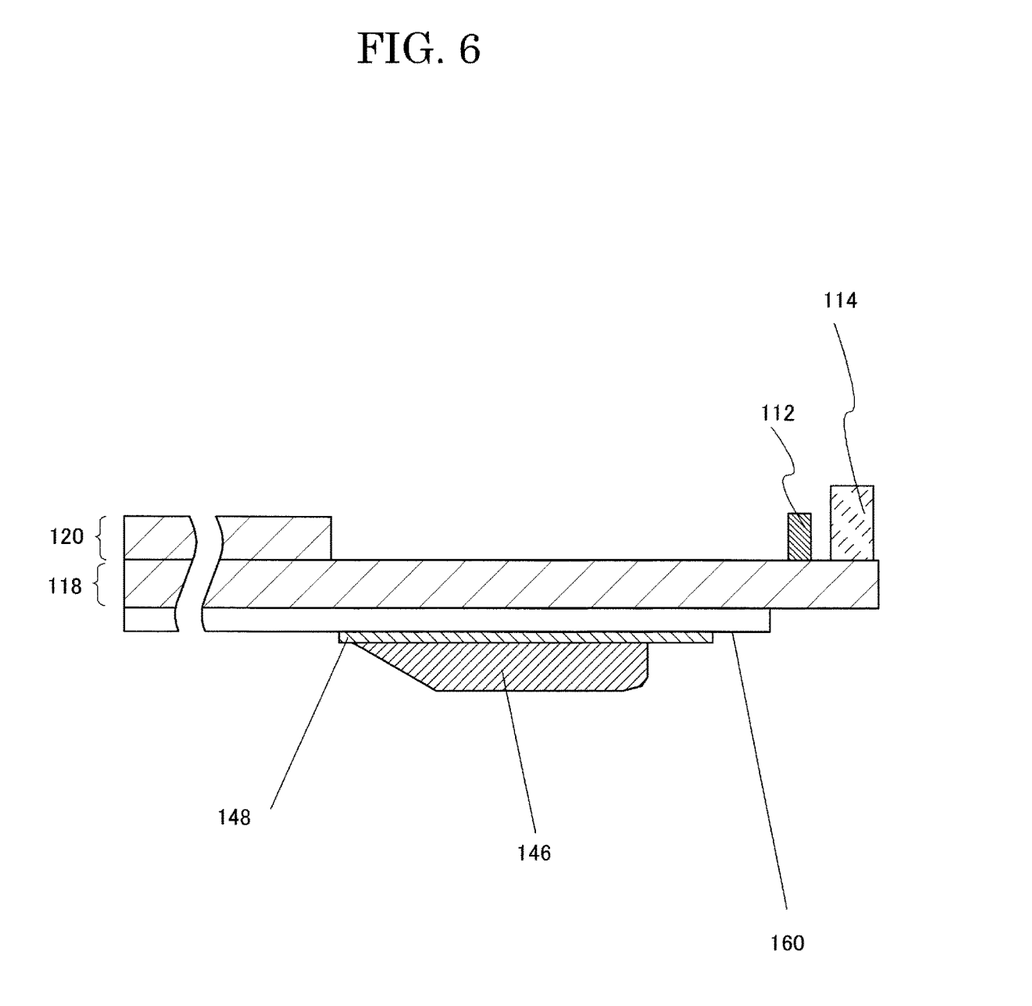
FIG. 6 is a cross-sectional view showing a method for producing the display device in the embodiment according to the present invention.

As shown in FIG. 3 and FIG. 6, the protective film 160 is located from a portion where the TFT-side substrate 118 and the CF-side substrate 120 overlap each other to a portion where the adhesive material 148 and the filling member 146 are provided. In FIG. 3 and FIG. 6, the protective film 160 does not extend to the end of the TFT-side substrate 118 along which the terminal region 114 is provided. Alternatively, the protective film 160 may extend to the end. The protective film 160 includes a portion in contact with the curved portion 130 and a portion in contact with the non-curved portion of the TFT-side substrate 118.

<Production Method in Embodiment 2>

From the state shown in FIG. 4, the adhesive material 148, the filling member 146 and the protective film 160 are formed to provide the state shown in FIG. 6. The adhesive material 148 may be formed of a commonly used pressure-sensitive adhesive such as an acrylic pressure-sensitive adhesive or the like. The filling member 146 may be formed of a commonly used resin such as an epoxy resin, a polyamide resin, a polyimide resin or the like. The protective film 160 may be formed of, for example, a resin such as polyimide or the like.

From the state shown in FIG. 6, the TFT-side substrate 118 is folded back to provide the state shown in FIG. 3. A part of the protective film 160 that overlaps the folded-back portion of the TFT-side substrate 118 is also folded together with the TFT-side substrate 118. For folding the TFT-side substrate 118, it is desirable to put into contact, or bond, the TFT-side substrate 118, the adhesive material 148, the filling member 146 and the protective film 160 with each other at the points A through F in the order of points A, B, C, D, E and F shown in FIG. 7. In this manner, no gap is formed in the part inner to the folded-back portion, and thus the lines located in the TFT-side substrate 118 are prevented from being broken.

The structure of the display device 100 is described above. With the above-described structure, a flexible display device in an embodiment according to the present invention is provided in which no gap is formed in the part inner to the folded-back portion and thus the lines are not easily broken.

The above-described embodiments and examples are merely examples, and the technological scope of the present invention is not limited to any of the above-described embodiments or examples. A person of ordinary skill in the art would make various alterations without departing from the gist of the present invention. Therefore, such alterations are to be construed to be encompassed in the technological scope of the present invention.

What is claimed is:

1. A display device, comprising:
    a substrate having a front surface at which pixels are provided and a rear surface opposite to the front surface, the substrate including a peripheral region located along a first side of the substrate and folded back to face the rear surface, and a counter region facing the peripheral region;
    a filling member held between the peripheral region and the counter region;
    a first overlapping portion of the substrate where a part of the peripheral region is bonded with the counter region with an adhesive material being provided therebetween;
    a second overlapping portion of the substrate where a part of the peripheral region is in contact with the filling member; and
    a third overlapping portion of the substrate where a part of the peripheral region is bonded with the filling member with the adhesive material being provided therebetween,
    wherein the first overlapping portion is located along the first side, the third overlapping portion is located further inward than the first overlapping portion from the first side of the substrate, the second overlapping portion is located between the first overlapping portion and the third overlapping portion, and the first overlapping portion of the substrate and the filling member do not overlap.

2. The display device according to claim 1, wherein:
    the peripheral region includes a curved portion; and
    the curved portion is contacting with the filling member.

3. The display device according to claim 2, wherein the peripheral region includes a non-curved portion between the curved portion and the first side.

4. The display device according to claim 3, wherein the non-curved portion has a driving circuit provided therein.

5. The display device according to claim 1, wherein:
    the peripheral region includes a curved portion; and
    a space is not provided between the curved portion and the filling member.

6. The display device according to claim 1, wherein:
the filling member is made gradually thinner from the second overlapping portion toward the first overlapping portion.

7. The display device according to claim 1, further comprising a protective film provided on the rear surface of the substrate;
wherein the adhesive material is provided on the protective film.

8. The display device according to claim 7, wherein:
the peripheral region includes a curved portion; and
the protective film includes a portion in contact with the rear surface of the curved portion.

9. The display device according to claim 8, wherein:
the peripheral region includes a non-curved portion between the curved portion and the first side; and
the protective film includes a portion in contact with the non-curved portion.

10. The display device according to claim 7, wherein an end of the protective film is located on the counter region.

11. The display device according to claim 1, wherein:
the adhesive material is formed of a pressure-sensitive adhesive tape; and
the pressure-sensitive adhesive tape is located along the entirety of the first side.

12. The display device according to claim 1, wherein:
the adhesive material is formed of a pressure-sensitive adhesive tape; and
the pressure-sensitive adhesive tape is located along a part of the first side.

13. The display device according to claim 1, wherein the filling member is formed of a resin.

14. The display device according to claim 1, wherein the substrate is formed of a resin.

15. The display device according to claim 1, further comprising a counter substrate facing the substrate, wherein:
the counter substrate covers a part of the front surface of the substrate; and
the front surface of the peripheral region is not covered with the counter substrate.

* * * * *